US012689381B2

(12) United States Patent
Ke

(10) Patent No.: US 12,689,381 B2
(45) Date of Patent: Jul. 21, 2026

(54) SERIALIZER AND METHOD FOR OPERATING THE SAME

(71) Applicant: TAIWAN SEMICONDUCTOR MANUFACTURING COMPANY LTD., Hsinchu (TW)

(72) Inventor: Han-Tzung Ke, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 122 days.

(21) Appl. No.: 18/670,761

(22) Filed: May 22, 2024

(65) Prior Publication Data

US 2025/0364998 A1 Nov. 27, 2025

(51) Int. Cl.
*H03L 7/099* (2006.01)
*H03L 7/199* (2006.01)

(52) U.S. Cl.
CPC ............ *H03L 7/0992* (2013.01); *H03L 7/199* (2013.01)

(58) Field of Classification Search
CPC ......... H03L 7/0992; H03L 7/199; H03L 7/00; G06F 1/06
See application file for complete search history.

(56) References Cited

U.S. PATENT DOCUMENTS

| | | | | | |
|---|---|---|---|---|---|
| 5,111,160 A | * | 5/1992 | Hershberger | ............ | H04N 5/46 |
| | | | | | 331/25 |
| 6,552,619 B2 | * | 4/2003 | Shastri | .................. | H04L 7/0337 |
| | | | | | 331/25 |

| | | | | | |
|---|---|---|---|---|---|
| 6,759,881 B2 | * | 7/2004 | Kizer | ........................ | H03L 7/07 |
| | | | | | 327/158 |
| 6,911,853 B2 | * | 6/2005 | Kizer | .................... | H03L 7/0805 |
| | | | | | 327/158 |
| 6,922,091 B2 | * | 7/2005 | Kizer | ........................ | H03L 7/07 |
| | | | | | 327/159 |
| 6,952,123 B2 | * | 10/2005 | Kizer | .................... | H03K 5/135 |
| | | | | | 327/158 |
| 6,960,948 B2 | * | 11/2005 | Kizer | ........................ | G06F 1/10 |
| | | | | | 327/158 |
| 7,046,056 B2 | * | 5/2006 | Kizer | .................... | H03L 7/0805 |
| | | | | | 327/158 |

(Continued)

FOREIGN PATENT DOCUMENTS

| | | | | | |
|---|---|---|---|---|---|
| CN | | 102403043 A | * | 4/2012 | ............. G11C 29/38 |
| CN | | 102403043 B | * | 6/2014 | ............. G11C 29/12 |

(Continued)

*Primary Examiner* — Berhanu Tadese
(74) *Attorney, Agent, or Firm* — WPAT LAW; Anthony King

(57) ABSTRACT

The present disclosure provides a circuit, which includes a clock generator, a selection control circuit, and a selection circuit. The clock generator is configured to divide an input clock signal into a first divided clock set and a second divided clock set, and generate a control clock set from the first divided clock set and the second divided clock. The selection control circuit is configured to generate a first selection signal and a second selection signal using the control clock set. The selection circuit is configured to sequentially output each bit of an input data signal within a duration of predetermined clock cycles of the input clock signal based on the first selection signal and the second selection signal.

20 Claims, 17 Drawing Sheets

(56) References Cited

U.S. PATENT DOCUMENTS

| | | | | |
|---|---|---|---|---|
| 7,058,840 B2 * | 6/2006 | Marx | G06F 5/06 | 713/503 |
| 7,079,055 B2 * | 7/2006 | Padaparambil | H03M 9/00 | 341/100 |
| 7,081,782 B2 * | 7/2006 | Kizer | H03L 7/07 | 327/158 |
| 7,135,903 B2 * | 11/2006 | Kizer | G06F 1/10 | 327/159 |
| 7,227,393 B1 * | 6/2007 | Savoj | H03L 7/0812 | 327/147 |
| 7,227,918 B2 * | 6/2007 | Aung | H03M 9/00 | 375/355 |
| 7,315,596 B2 * | 1/2008 | Payne | H04L 7/0337 | 375/355 |
| 7,319,345 B2 * | 1/2008 | Farjad-rad | H03L 7/0812 | 327/295 |
| 7,372,381 B2 * | 5/2008 | Chan | G09G 5/006 | 341/100 |
| 7,423,570 B2 * | 9/2008 | Asayama | H03M 1/1014 | 341/139 |
| 7,535,271 B2 * | 5/2009 | Kizer | H03L 7/0805 | 327/156 |
| 7,672,406 B2 * | 3/2010 | Takeuchi | H03L 7/091 | 375/345 |
| 7,782,990 B1 * | 8/2010 | Snow | H03L 7/08 | 375/355 |
| 7,821,343 B1 * | 10/2010 | Wong | H03L 7/23 | 331/49 |
| 7,822,114 B2 * | 10/2010 | Bulzacchelli | H04L 25/067 | 375/233 |
| 7,825,707 B2 * | 11/2010 | Ebuchi | H03L 7/093 | 327/147 |
| 7,864,084 B2 * | 1/2011 | Padaparambil | H03M 9/00 | 341/100 |
| 7,902,890 B2 * | 3/2011 | Kizer | G06F 1/10 | 327/158 |
| 7,948,415 B2 * | 5/2011 | Asayama | H03M 1/1014 | 341/139 |
| 8,120,399 B2 * | 2/2012 | Kizer | H03L 7/07 | 327/158 |
| 8,319,523 B2 * | 11/2012 | Reid | H04L 25/14 | 326/83 |
| 8,453,043 B2 * | 5/2013 | Chien | G11C 29/36 | 714/704 |
| 8,674,865 B2 * | 3/2014 | Asayama | H03M 1/1014 | 341/139 |
| 8,680,903 B2 * | 3/2014 | Kizer | G06F 1/10 | 327/158 |
| 8,837,467 B2 * | 9/2014 | Kyles | H03M 9/00 | 370/366 |
| 8,963,599 B2 * | 2/2015 | Dobbs | G06F 11/1604 | 327/258 |
| 9,154,142 B2 * | 10/2015 | Dobbs | G06F 11/1604 | |
| 9,229,050 B2 * | 1/2016 | Tsai | G01R 31/31726 | |
| 9,264,057 B2 * | 2/2016 | Asayama | H04N 25/78 | |
| 9,325,329 B2 * | 4/2016 | Dobbs | H03L 7/085 | |
| 9,432,298 B1 * | 8/2016 | Smith | H04L 47/34 | |
| 9,450,590 B2 * | 9/2016 | Dobbs | G06F 1/08 | |
| 9,461,811 B1 * | 10/2016 | Chien | H03L 7/0998 | |
| 9,608,523 B1 * | 3/2017 | Iwai | H03K 21/02 | |
| 9,705,510 B2 * | 7/2017 | Kumazawa | H03L 7/0807 | |
| 9,882,574 B2 * | 1/2018 | Asayama | H04N 25/78 | |
| 9,887,863 B2 * | 2/2018 | Chen | H04B 1/40 | |
| 10,007,293 B2 * | 6/2018 | Dobbs | H03K 3/0315 | |
| 10,007,320 B2 * | 6/2018 | Zhang | G06F 13/4282 | |
| 10,110,334 B2 * | 10/2018 | Gupta | H04L 7/0037 | |
| 10,340,904 B2 * | 7/2019 | Ke | H03K 19/1737 | |
| 10,547,318 B2 * | 1/2020 | Asayama | H03M 1/66 | |
| 10,623,006 B2 * | 4/2020 | Nelson | H03K 5/082 | |
| 10,749,534 B2 * | 8/2020 | Nelson | H03L 7/0807 | |
| 10,749,535 B2 * | 8/2020 | Nelson | H03K 5/082 | |
| 10,848,161 B2 * | 11/2020 | Nelson | H03K 5/133 | |
| 10,868,663 B1 * | 12/2020 | Turker Melek | H04L 7/0004 | |

| | | | | |
|---|---|---|---|---|
| 10,904,044 B2 * | 1/2021 | Palusa | H04L 25/028 | |
| 11,038,511 B2 * | 6/2021 | Weeks | H03L 7/0805 | |
| 11,063,596 B1 * | 7/2021 | Wang | H03L 7/0818 | |
| 11,177,816 B2 * | 11/2021 | Weeks | H03L 7/1075 | |
| 11,228,416 B1 * | 1/2022 | Huss | G06F 1/12 | |
| 11,240,075 B2 * | 2/2022 | Palusa | H04L 25/03057 | |
| 11,416,021 B2 * | 8/2022 | Xavier | G06F 1/10 | |
| 11,469,877 B1 * | 10/2022 | Raj | H04L 25/4917 | |
| 11,474,554 B2 * | 10/2022 | Wang | G06F 1/08 | |
| 11,705,914 B2 * | 7/2023 | Nelson | G06F 1/10 | 375/376 |
| 12,074,737 B2 * | 8/2024 | Palusa | H04L 25/03038 | |
| 12,169,446 B2 * | 12/2024 | Zhong | G06F 11/2273 | |
| 12,212,328 B2 * | 1/2025 | Nelson | H03L 7/0807 | |
| 12,255,661 B1 * | 3/2025 | Puscar | H03L 7/18 | |
| 2002/0178392 A1 * | 11/2002 | Marx | H03K 5/135 | 713/500 |
| 2007/0127614 A1 * | 6/2007 | Kawakami | H03L 7/06 | 375/373 |
| 2007/0147569 A1 * | 6/2007 | Chang | H03L 7/0814 | 375/373 |
| 2007/0194962 A1 * | 8/2007 | Asayama | H04N 25/78 | 341/144 |
| 2008/0094109 A1 * | 4/2008 | Farjad-Rad | H03L 7/0998 | 327/99 |
| 2009/0009641 A1 * | 1/2009 | Asayama | H03M 1/1014 | 348/294 |
| 2009/0259781 A1 * | 10/2009 | Padaparambil | H03K 5/135 | 710/71 |
| 2011/0037505 A1 * | 2/2011 | Kawamoto | H03L 7/07 | 327/159 |
| 2011/0221619 A1 * | 9/2011 | Asayama | H03M 1/66 | 341/144 |
| 2012/0066559 A1 * | 3/2012 | Chien | G11C 29/12 | 714/704 |
| 2012/0207259 A1 * | 8/2012 | Crain | H04L 7/033 | 375/376 |
| 2012/0223752 A1 * | 9/2012 | Huang | H03L 7/0893 | 327/157 |
| 2013/0038366 A1 * | 2/2013 | Tsai | G01R 31/3016 | 327/158 |
| 2014/0167825 A1 * | 6/2014 | Dobbs | G06F 1/04 | 327/158 |
| 2015/0014516 A1 * | 1/2015 | Asayama | H03M 1/1014 | 341/144 |
| 2015/0162920 A1 * | 6/2015 | Dobbs | G06F 1/04 | 327/158 |
| 2016/0218731 A1 * | 7/2016 | Asayama | H04N 25/78 | |
| 2017/0111193 A1 * | 4/2017 | Chen | H04L 5/06 | |
| 2017/0310412 A1 * | 10/2017 | Gupta | H04J 3/0682 | |
| 2017/0373675 A1 * | 12/2017 | Ke | H03K 5/1565 | |
| 2018/0123608 A1 * | 5/2018 | Asayama | H04N 25/78 | |
| 2018/0151221 A1 * | 5/2018 | Chen | G11C 11/418 | |
| 2024/0372759 A1 * | 11/2024 | Palusa | H04L 25/03038 | |

FOREIGN PATENT DOCUMENTS

| | | | | | |
|---|---|---|---|---|---|
| CN | 105553470 B | * | 8/2018 | | H03L 7/18 |
| CN | 108519792 B | * | 11/2021 | | H03L 7/06 |
| CN | 114461473 A | * | 5/2022 | | G06F 11/2221 |
| CN | 114978202 A | * | 8/2022 | | H04B 1/04 |
| CN | 114461473 B | * | 3/2023 | | G06F 11/2221 |
| CN | 118400795 A | * | 7/2024 | | H04W 56/001 |
| CN | 118400795 B | * | 8/2024 | | H04W 56/001 |
| DE | 10122702 A1 | * | 11/2002 | | H03K 5/135 |
| DE | 10122702 C2 | * | 8/2003 | | H03K 5/135 |
| EP | 0511798 A2 | * | 11/1992 | | H03L 7/095 |
| EP | 0511798 B1 | * | 11/1996 | | H04N 11/04 |
| EP | 2932345 B1 | * | 3/2017 | | H03L 7/085 |
| EP | 2932346 B1 | * | 3/2017 | | H03L 7/085 |
| EP | 2932600 B1 | * | 8/2017 | | H03L 7/085 |
| EP | 3200042 A2 | * | 8/2017 | | H03L 7/085 |
| EP | 3264605 A1 | * | 1/2018 | | H03M 9/00 |
| EP | 3200042 B1 | * | 2/2019 | | H03L 7/085 |
| EP | 3493017 A2 | * | 6/2019 | | H03L 7/085 |
| EP | 3493017 B1 | * | 8/2020 | | H03K 3/0315 |
| JP | 2009260961 A | * | 11/2009 | | H03M 9/00 |

(56) References Cited

FOREIGN PATENT DOCUMENTS

| JP | 2011041121 | A | * | 2/2011 | ............... | H03L 7/07 |
| KR | 20150086844 | A | * | 7/2015 | ............. | G09G 5/008 |
| KR | 20170111193 | A | * | 10/2017 | .......... | G06F 3/0659 |
| KR | 20230090992 | A | * | 6/2023 | ............. | H04L 1/203 |
| TW | 541800 | B | * | 7/2003 | ............. | H03L 7/081 |
| TW | 201138318 | A | * | 11/2011 | ............. | H03L 7/091 |
| TW | 201742379 | A | * | 12/2017 | ............. | H03M 9/00 |
| TW | I741960 | B | * | 10/2021 | .......... | H03L 7/0805 |
| TW | 202228400 | A | * | 7/2022 | .......... | H03L 7/0812 |
| TW | 202228402 | A | * | 7/2022 | .......... | H04L 7/0033 |
| TW | I773255 | B | * | 8/2022 | ......... | H04L 27/2656 |
| WO | WO-0180238 | A1 | * | 10/2001 | ....... | G11B 20/10055 |
| WO | WO-2005117266 | A1 | * | 12/2005 | .......... | H03L 7/0995 |
| WO | WO-2010103626 | A1 | * | 9/2010 | ............. | H03K 5/133 |
| WO | WO-2014093862 | A1 | * | 6/2014 | ............. | H03L 7/085 |
| WO | WO-2014093878 | A1 | * | 6/2014 | ............. | H03L 7/085 |
| WO | WO-2014093890 | A1 | * | 6/2014 | ............. | H03L 7/085 |
| WO | WO-2017189497 | A1 | * | 11/2017 | ............. | H03M 9/00 |

* cited by examiner

203A 1, 1, 1, 1

CD2, CD2B, 0, 0

2031A

2032A

SELB[0:3]

SEL[0:3]

203A 1, 1, 1, 1

1, 0, 0, 0

2031A

2032A

SELB[0:3]

SEL[0:3]

203B

CD8, CD8, CD8, CD8, CD8B, 1, 1, 1

CD4, CD4, CD4B, CD4B, CD4, 0, 0, 0

CD2, CD2B, CD2, CD2, CD2B, CD2, 0, 0, 0

2031B

2032B

SELB[0:7]

SEL[0:7]

FIG. 8B

SERIALIZER AND METHOD FOR OPERATING THE SAME

BACKGROUND

In a serial-deserial (SerDes) data link, the transmitter device's serializer converts low-speed parallel digital data into high-speed serial digital data, which is then transmitted to the receiver device's deserializer. The deserializer then processes the digital data for use in the receiver device. As the operating speed of these data links continues to rise, there is a growing need for a serializer that offers low power consumption and a smaller area.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features can be arbitrarily increased or reduced for clarity of discussion.

FIG. 8B is another block diagram of a selection control circuit in accordance with some embodiments of the present disclosure.

DETAILED DESCRIPTION

Figure 1:
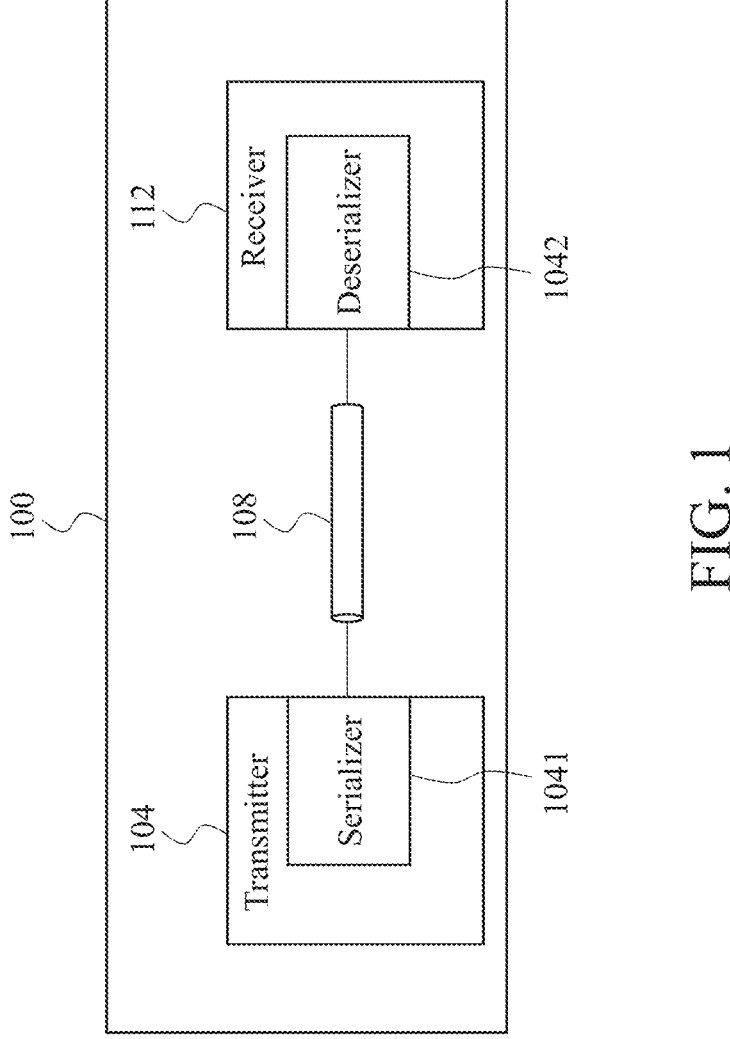
FIG. 1 is a block diagram of a communication system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, it will be understood that when an element is referred to as being "connected to" or "coupled to" another element, it can be directly connected to or coupled to the other element, or intervening elements can be present.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device can be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

FIG. 1 is a block diagram of a communication system in accordance with some embodiments of the present disclosure.

In some embodiments, the communication system 100 may include a transmitter 104 and a receiver 112. The transmitter 104 is communicatively coupled to the receiver 112 via a communication channel 108. The transmitter 104 is configured to send one or more signals to the receiver 112 through the communication channel 108. The communication channel 108 may be a physical transmission medium, such as a backplane, drive head in a magnetic recording system, copper cables, optical fibers, one or more coaxial cables, and/or wire, or the communication channel 108 may include a one or more radio frequency (RF) channels. Although described herein as being utilized in a communication system 100, examples of the present disclosure are not so limited, and some examples might be employed in alternative communications systems utilizing a transmitter and a receiver communicating over a communication channel. Moreover, it is understood that each "bit" of a signal has a corresponding logic value and that various signals described herein may utilize multi-bit data symbols based on various data encoding schemes, such as pulse amplitude modulation (e.g., PAM-4).

In some embodiments, the transmitter 104 may include a serializer 1041 configured to convert a plurality of bits of a parallel input data signal to a serial data signal. Additionally, the receiver 112 may include a deserializer 1042 configured to convert a serial data signal to a parallel data signal. For example, the serializer 1041 may send the serial data signal, which is converted from a parallel input data signal, to the deserializer 1042 through the communication channel 108. Accordingly, the communication system 100 can also be regarded as a SerDes (serializer/deserializer) communication system.

Figure 2:
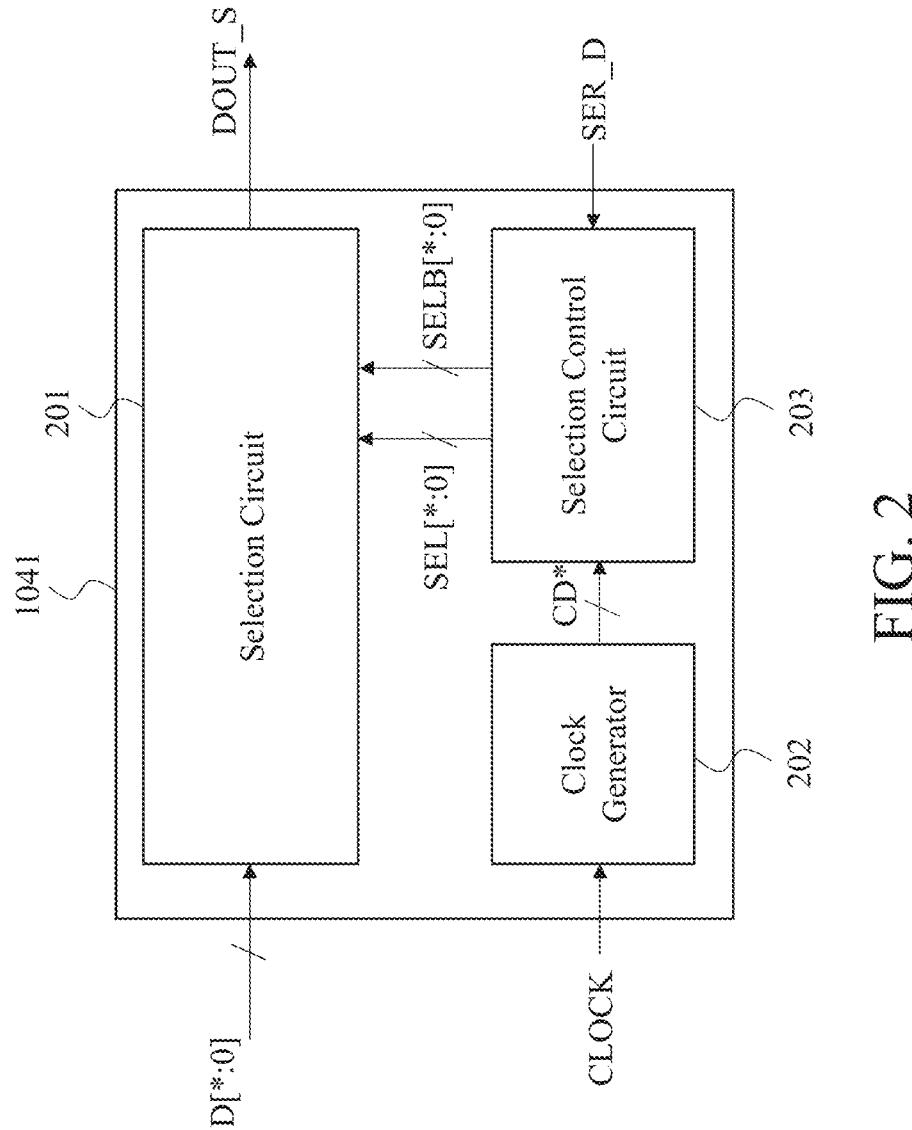
FIG. 2 is a block diagram of a serializer in accordance with some embodiments of the present disclosure.

FIG. 2 is a block diagram of a serializer in accordance with some embodiments of the present disclosure.

In some embodiments, the serializer 1041 may include a selection circuit 201, a clock generator 202, and a selection control circuit 203, as depicted in FIG. 2. The clock generator 202 may be configured to generate a control clock set CD* based on the setting value SER_D of parallel bits of the input data signal DIN [*:0] used by the serializer 1042. Additionally, the number of parallel bits to be converted into the serial output data signal DOUT_S may be an arbitrary positive integer number. The arbitrary positive integer number can be either the nth power of 2 (e.g., $2^N$) or non-nth power of 2 (e.g., non-$2^N$). The details of the clock generator 202 will be described later.

The selection control circuit 203 may be configured to generate a plurality of selection signals SEL[*:0] and corresponding inverse selection signals SELB[*:0] based on the control clock set CD* generated by the clock generator 202. The selection signals SEL[*:0] and corresponding inverse selection signals SELB[*:0] may control the selection circuit 201 to sequentially select each valid bit of the input data signal DIN and output the selected valid bit as the serial output data signal DOUT_S. For example, the input data signal DIN may have N bits (i.e., DIN[N−1:0]), where N is a positive integer. Given that N=8 and the setting value SER_D=4, the serializer 1041 can perform serialization on the four least significant bits, which can be regarded as the valid bits, of the input data signal DIN (i.e., DIN[3:0]) to generate the serial output data signal DOUT_S.

Figure 3:
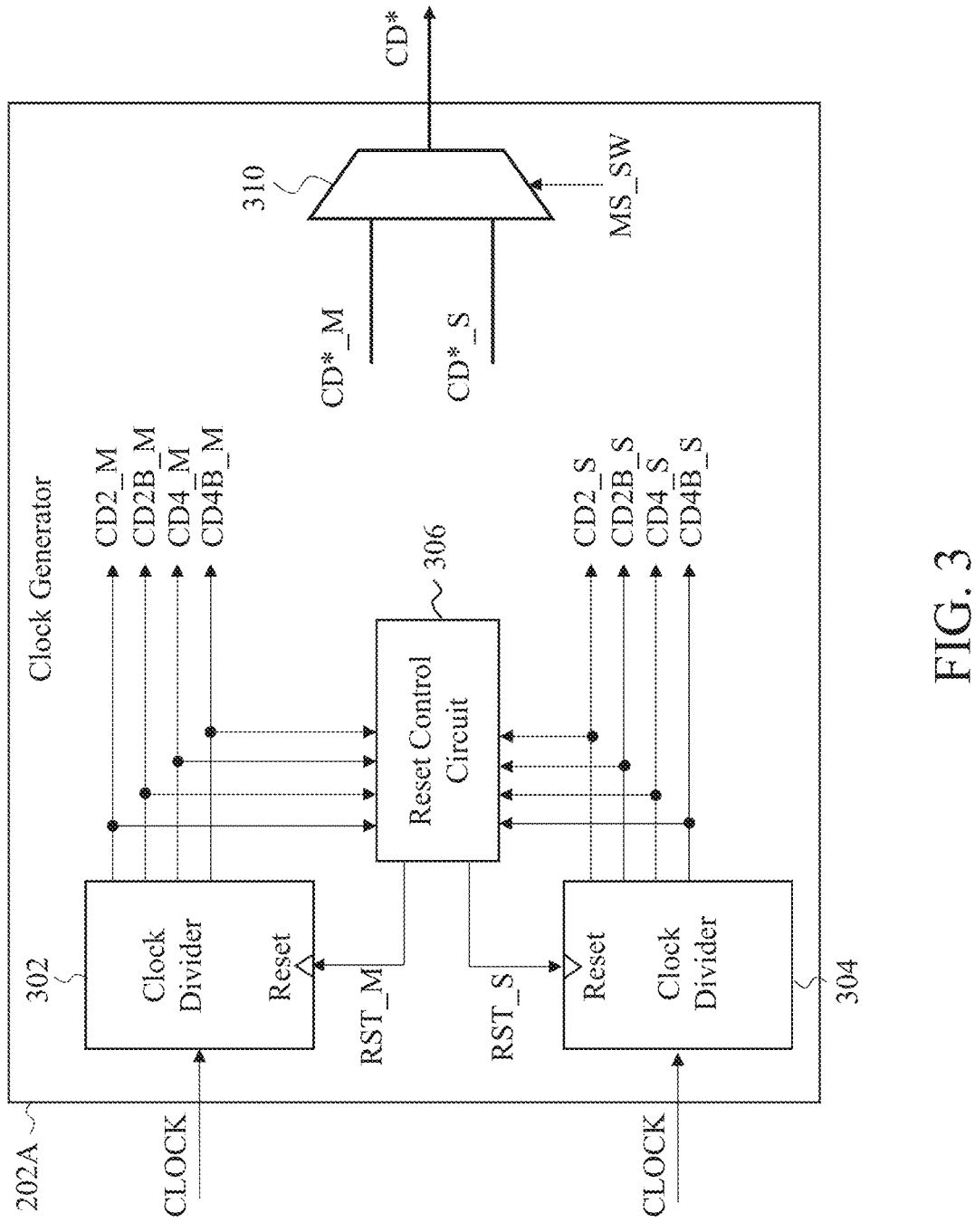
FIG. 3 is a block diagram of a clock generator in accordance with some embodiments of the present disclosure.
Figure 4A:
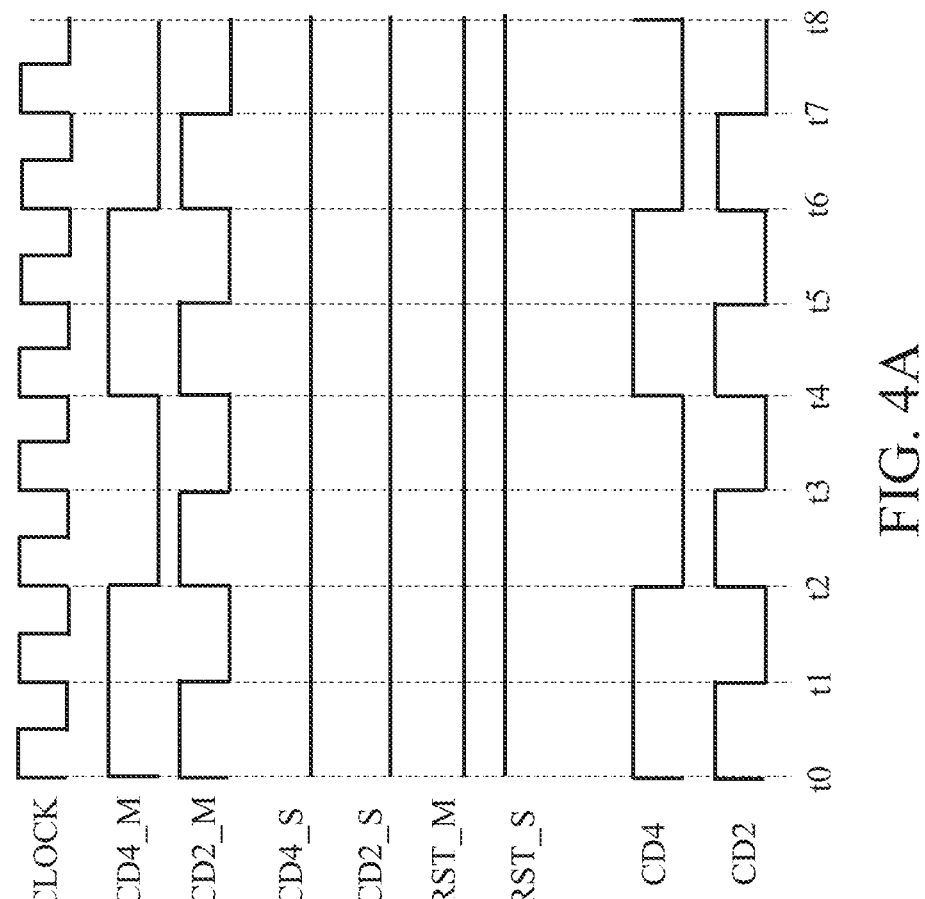
FIG. 4A is a waveform diagram of various signals for 4-to-1 serialization during operation of the clock generator in FIG. 3.
Figure 4B:
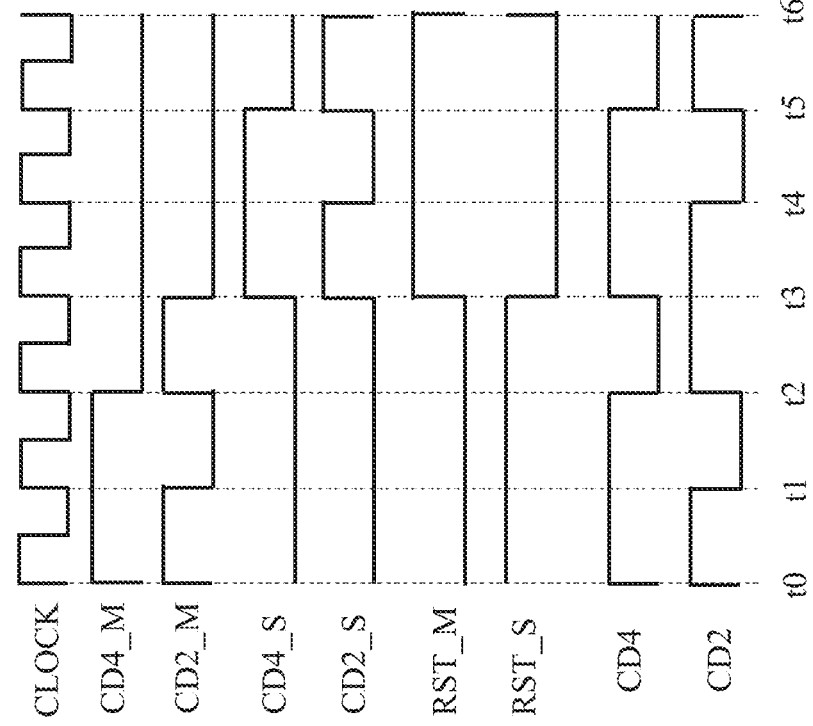
FIG. 4B is a waveform diagram of various signals for 3-to-1 serialization during operation of the clock generator in FIG. 3.

FIG. 3 is a block diagram of a clock generator in accordance with some embodiments of the present disclosure. FIG. 4A is a waveform diagram of various signals for 4-to-1 serialization during operation of the clock generator in FIG. 3. FIG. 4B is a waveform diagram of various signals for 3-to-1 serialization during operation of the clock generator in FIG. 3.

In some embodiments, the clock generator 202 in FIG. 2 can be implemented using the clock generator 202A shown in FIG. 3. The clock generator 202A may include clock dividers 302 and 304, a reset control circuit 306, and a multiplexing circuit 310. The clock dividers 302 and 304 may be synchronous clock dividers which can divide the input clock signal CLOCK into a plurality of divided clock signals in multiples of 2 (e.g., CD2_M, CD4_M, CD2_S, CD4_S) as well as their respective inverse divided clock signals (e.g., CD2B_M, CD4B_M, CD2B_S, CD4B_S). The clock dividers 302 and 304 may act as a master clock divider and a slave clock divider, respectively.

In some embodiments, the clock dividers 302 and 304 can be reset using reset signals RST_M and RST_S, respectively. For example, when the reset signal RST_M is in a high logic state, the divided clock signals CD2_M, CD2B_M, CD4_M, and CD4B_M generated by the clock divider 302 (e.g., the master clock divider) will be set to 0 (i.e., deactivated). Similarly, when the reset signal RST_S is in a high logic state, the divided clock signals CD2_S, CD2B_S, CD4_S, and CD4B_S generated by the clock divider 302 (e.g., the slave clock divider) will be set to 0 (i.e., deactivated). For example, CD2_M and CD2_S may refer to clock signals that are synchronous to the input clock signal CLOCK and can be obtained by dividing the frequency of the input clock signal CLOCK by 2, resulting in the period of CD2_M and CD2_S being twice that of the input clock signal CLOCK. CD2B_M and CD2B_S are the inverse clock signals of the divided clock signals CD2_M and CD2_S, respectively. Similarly, CD4_M and CD4_S may refer clock signals that are synchronous to the input clock signal CLOCK and can be obtained by dividing the frequency of the input clock signal CLOCK by 4, resulting in the period the divided clock signal CD4_M and CD4_S being four times that of the input clock signal CLOCK. CD4B_M and CD4B_S are the inverse clock signals of the divided clock signals CD4_M and CD4_S, respectively.

In some embodiments, during operation of the serializer 202A, when the setting value SER_D is a power of 2 (e.g., $2^N$), the reset signal RST_S generated by the reset control circuit 306 is maintained at the high logic state (e.g., "1"), deactivating the clock divider 304 (e.g., the slave clock divider). Additionally, during operation of the serializer 202A, when the setting value SER_D is not a power of 2 (e.g., $2^N$), either the reset signal RST_M or RST_S generated by the reset control circuit 306 is in the high logic state (e.g., "1"), indicating that either the clock divider 302 or 304 is activated at one time. The details thereof will be described in the embodiments of FIGS. 4A-4B.

It should be noted that, for purposes of description, the clock dividers 302 and 304 may have clock dividing factors of 2 and 4, resulting in the hardware configuration of the serializer 202A to support 4-to-1 serialization, which converts a 4-bit parallel data signal into the serial output data signal of four bits within four clock cycles of the input clock signal CLOCK. When the clock dividers 302 and 304 have additional clock dividing factors, such as 2, 4, 8, 16, etc. (e.g., powers of 2), the serializer 202A can implement a variety of serializations.

In some embodiments, the multiplexing circuit 310 may be configured to select, based on the selection control signal MS_SW, the divided clock sets CD*_M (e.g., CD2_M, CD2B_M, CD4_M, and CD4B_M) generated by the clock divider 302 or the divided clock set CD*_S (e.g., CD2_S, CD2B_S, CD4_S, and CD4B_S) generated by the clock divider 304. For example, when the selection control signal MS_SW is in the low logic state, the multiplexing circuit 310 may select the clock signal set CD*_M as the control clock set CD*. When the selection control signal MS_SW is in the high logic state, the multiplexing circuit 310 may select the clock signal set CD*_S as the control clock set CD*. In some embodiments, the selection control signal MS_SW can be expressed using equation (1) as follows.

$$MS\_SW = (RST\_M) \cdot (RST\_S') \qquad (1)$$

Specifically, when the setting value SER_D is a power of 2 (e.g., $2^N$), the reset signals RST_M and RST_S generated by the reset control circuit 306 are in the low logic state (e.g., "0") and high logic state (e.g., "1"), respectively, as shown in FIG. 4A. As a result, the clock divider 304 is deactivated. Additionally, the selection control signal MS_SW is in the low logic state, controlling the multiplexing circuit 310 to select divided clock set CD*_M generated by the clock divider 302. Thus, the control clock signals CD4 and CD2 follow the divided clock signals CD4_M and CD2_M generated by the clock divider 302, respectively.

When the setting value SER_D is not a power of 2 (e.g., 3), one of the reset signals RST_M and RST_S is in the high logic state (e.g., "1"), and the other of the reset signals RST_M and RST_S is in the low logic state (e.g., "0"). The reset control circuit 306 may toggle the logic states of the reset signals RST_M and RST_S upon detecting a specific pattern of the control clock signals (e.g., CD2 and CD4) in the control clock set CD*.

For example, referring to FIG. 4B, when a 3-to-1 serialization operation is performed, the reset signals RST_M and RST_S are in the low logic state and high logic state within the duration from time t0 to t3, activating the clock divider 302 and deactivating the clock divider 304. Accordingly, the multiplexing circuit 310 selects the divided clock set CD*_M generated by the clock divider 302 within the duration from time t0 to t3 since the selection control signal MS_SW is in the low logic state. Thus, the control clock signals CD4 and CD2 follow the divided clock signals CD4_M and CD2_M within the duration from time t0 to t3 (e.g., 3 clock cycles of the input clock signal CLOCK). Subsequently, the reset control circuit 306 may detect the specific pattern of the control clock signals CD4 and CD2, such as CD4=0 and CD2=1, at the rising edge of the input clock signal CLOCK at time t3, and the reset control circuit 306 then toggles the logic states of the reset signals RST_M and RST_S, resulting in the reset signal RST_M being 1 and the reset signal RST_S being 0. Due to 3-to-1 serialization, the reset signals RST_M and RST_S are kept at the high logic state and low logic state within the duration from time t3 to t6 (e.g., 3 clock cycles of the input clock signal CLOCK). Thus, the clock divider 302 is deactivated and the clock divider 304 is activated within the duration from time t3 to t6. In other words, the clock divider 304 starts to generate the divided clock signals CD4_S and CD2_S from time t3, resulting in the control clock signals CD4 and CD2 respectively following the divided clock signals CD4_S and CD2_S generated by the clock divider 304 within the duration from time t3 to t6.

FIGS. 5A-5D are schematic diagrams of a selection control circuit in different serialization modes in accordance with some embodiments of the present disclosure.

In some embodiments, the selection control circuit 203 shown in FIG. 2 can be implemented using the selection control circuit 203A shown in FIGS. 5A-5D. For example, FIGS. 5A-5D illustrate different operations of the selection control circuit 203A for 1-to-1, 2-to-1, 3-to-1, and 4-to-1 serialization modes, respectively. For example, the selection control circuit 203A may include a NAND gate 2031A and an inverter 2032A connected in series. The NAND gate 2031A may receive two predetermined input signals for each of the serialization modes to generate a selection signal SELB[0:3]. The inverter 2032A may invert the selection signal SELB[0:3] to generate a selection signal SEL[0:3].

Figure 5B:
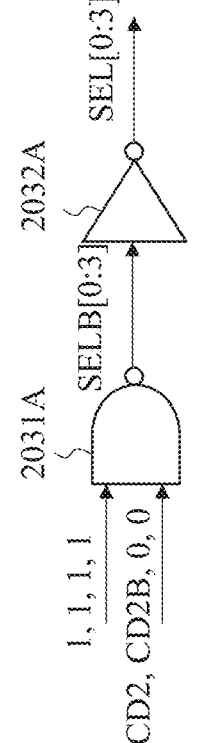
FIGS. 5A-5D are schematic diagrams of a selection control circuit in different serialization modes in accordance with some embodiments of the present disclosure.
Figure 5A:
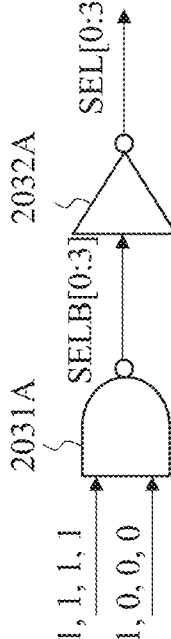

Referring to FIG. 5A, during the 1-to-1 serialization mode (e.g., SER_D=1), the input data signal DIN is considered as a 1-bit signal, which can be output as the serial output data signal DOUT_S every clock cycle of the input clock signal CLOCK. Thus, the selection signals SEL[0:3] and SELB[0:3] can be set to values that allows the least significantly bit (e.g., DIN[0]) of the input data signal DIN to be output every clock cycle. For example, the two predetermined input signals of the NAND gate 2031A are (1, 1, 1, 1) and (1, 0, 0, 0), where the least significant bit and the most significant bit of each input signal are the leftmost bit and rightmost bit, respectively. The NAND gate 2031A performs bitwise NAND operations to each bit of these two predetermined input signals, generating the selection signal SELB[0:3] being (0, 1, 1, 1). Subsequently, the inverter 2032A inverts the selection signal SELB[0:3] to generate the selection signal SEL[0:3] being (1, 0, 0, 0). Therefore, the least significant bit of the selection signal SEL[0:3] is 1, indicating that the least significant bit DIN[0] of the input data signal DIN can be selected every clock cycle of the input clock signal CLOCK.

Referring to FIG. 5B, during the 2-to-1 serialization mode (e.g., SER_D=2), the input data signal DIN is considered as a 2-bit signal, which can be output as the serial output data signal DOUT_S within two clock cycles of the input clock signal CLOCK. In this case, the two predetermined input signals of the NAND gate 2031A are (1, 1, 1, 1) and (CD2, CD2B, 0, 0). The NAND gate 2031A performs bitwise NAND operations to each bit of these two predetermined input signals, generating the selection signal SELB[0:3] being (CD2B, CD2, 1, 1). Subsequently, the inverter 2032A inverts the selection signal SELB[0:3] to generate the selection signal SEL[0:3] being (CD2, CD2B, 0, 0). Therefore, the least significant two bits of the selection signal SEL[0:3] is (CD2, CD2B), indicating that one of the least two significant bits DIN[0:1] of the input data signal DIN can be selected in an alternating fashion every two clock cycles of the input clock signal CLOCK.

Figures 5C, 5D:
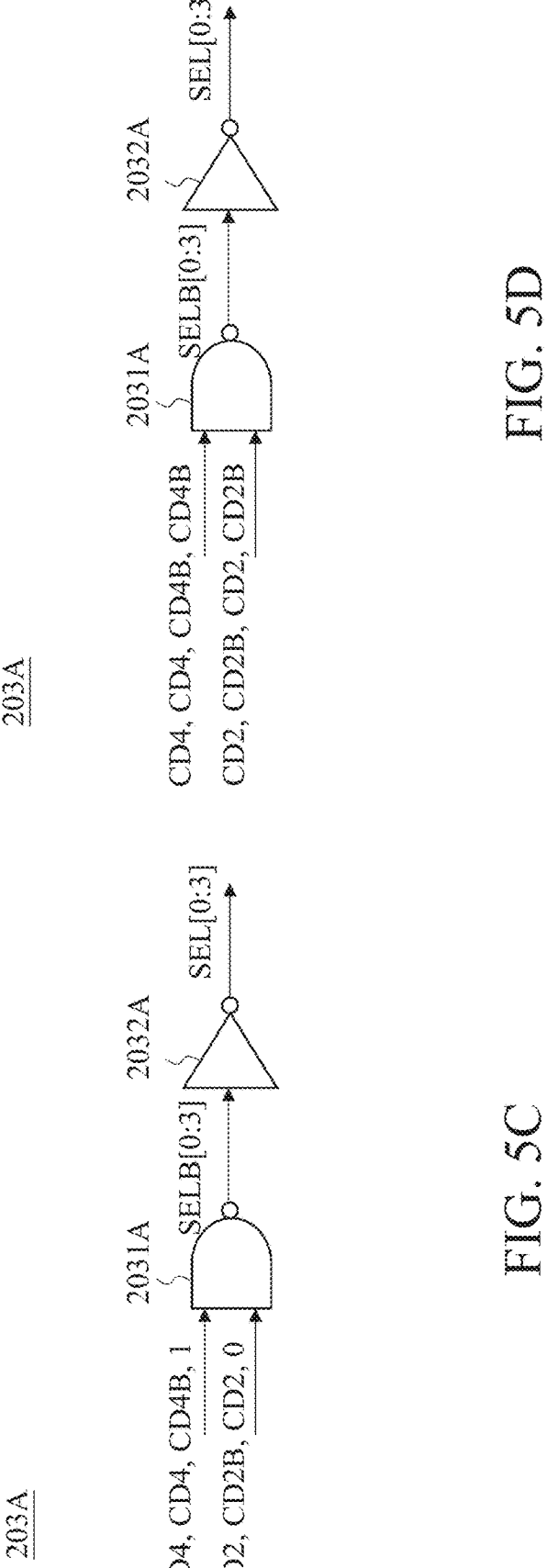

Referring to FIG. 5C, during the 3-to-1 serialization mode (e.g., SER_D=3), the input data signal DIN is considered as a 3-bit signal, which can be output as the serial output data signal DOUT_S within three clock cycles of the input clock signal CLOCK. In this case, the two predetermined input signals of the NAND gate 2031A are (CD4, CD4, CD4B, 1) and (CD2, CD2B, CD2, 0). The NAND gate 2031A performs bitwise NAND operations to each bit of these two predetermined input signals, generating the selection signal SELB[0:3] being ((CD4·CD2)', (CD4·CD2B)', (CD4B·CD2)', 1). Subsequently, the inverter 2032A inverts the selection signal SELB[0:3] to generate the selection signal SEL[0:3] being ((CD4·CD2), (CD4·CD2B), (CD4B·CD2), 1). Therefore, the least significant three bits of the selection signal SEL[0:3] is ((CD4·CD2), (CD4·CD2B), (CD4B·CD2)), indicating that the least three significant bits DIN[0:2] of the input data signal DIN can be selected sequentially every three clock cycles of the input clock signal CLOCK.

Referring to FIG. 5D, during the 4-to-1 serialization mode (e.g., SER_D=4), the input data signal DIN is considered as a 4-bit signal, which can be output as the serial output data signal DOUT_S within four clock cycles of the input clock signal CLOCK. In this case, the two predetermined input signals of the NAND gate 2031A are (CD4, CD4, CD4B, CD4B) and (CD2, CD2B, CD2, CD2B). The NAND gate 2031A performs bitwise NAND operations to each bit of these two predetermined input signals, generating the selection signal SELB[0:3] being ((CD4·CD2)', (CD4·CD2B)', (CD4B·CD2)', (CD4B·CD2B)'). Subsequently, the inverter 2032A inverts the selection signal SELB[0:3] to generate the selection signal SEL[0:3] being ((CD4·CD2), (CD4·CD2B), (CD4B·CD2), (CD4B·CD2B)). Therefore, the least significant four bits of the selection signal SEL[0:3] is ((CD4·CD2), (CD4·CD2B), (CD4B·CD2), (CD4B·CD2B)), indicating that the least four significant bits DIN[0:3] of the input data signal DIN can be selected sequentially every four clock cycles of the input clock signal CLOCK.

Figure 6B:
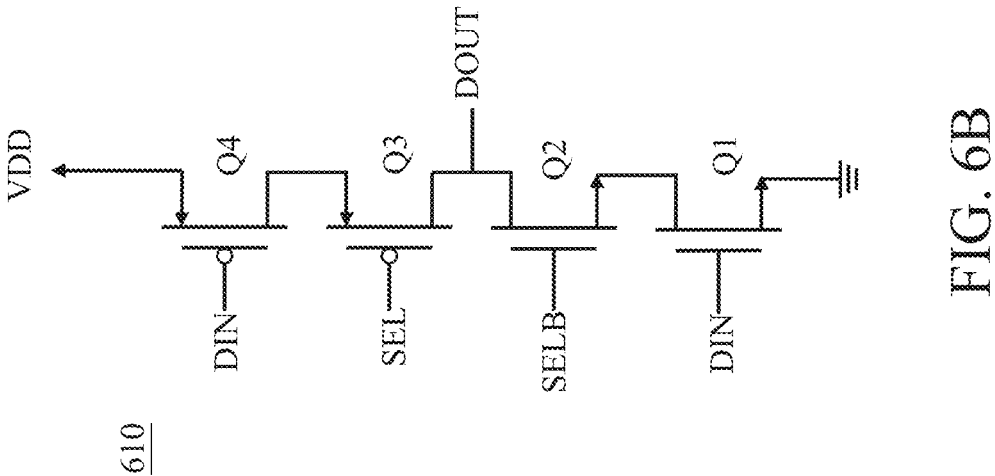
FIG. 6B is a schematic diagram of the inverter in FIG. 6A.
Figure 6A:
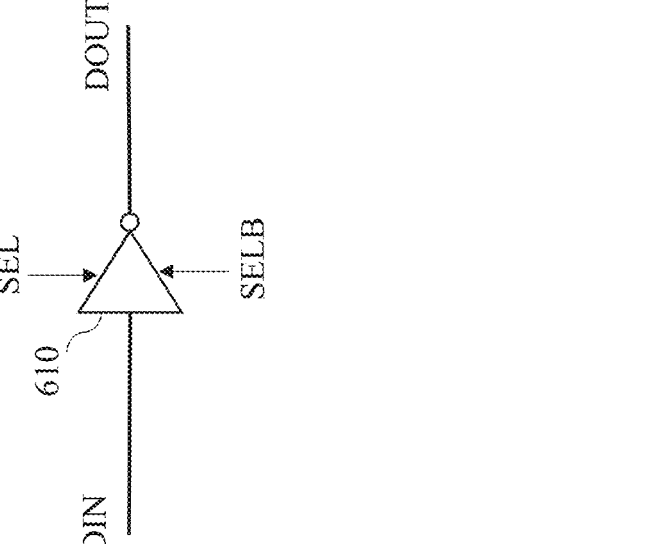
FIG. 6A is a block diagram of an inverter for use in a selection circuit in accordance with some embodiments of the present disclosure.
Figure 6C:
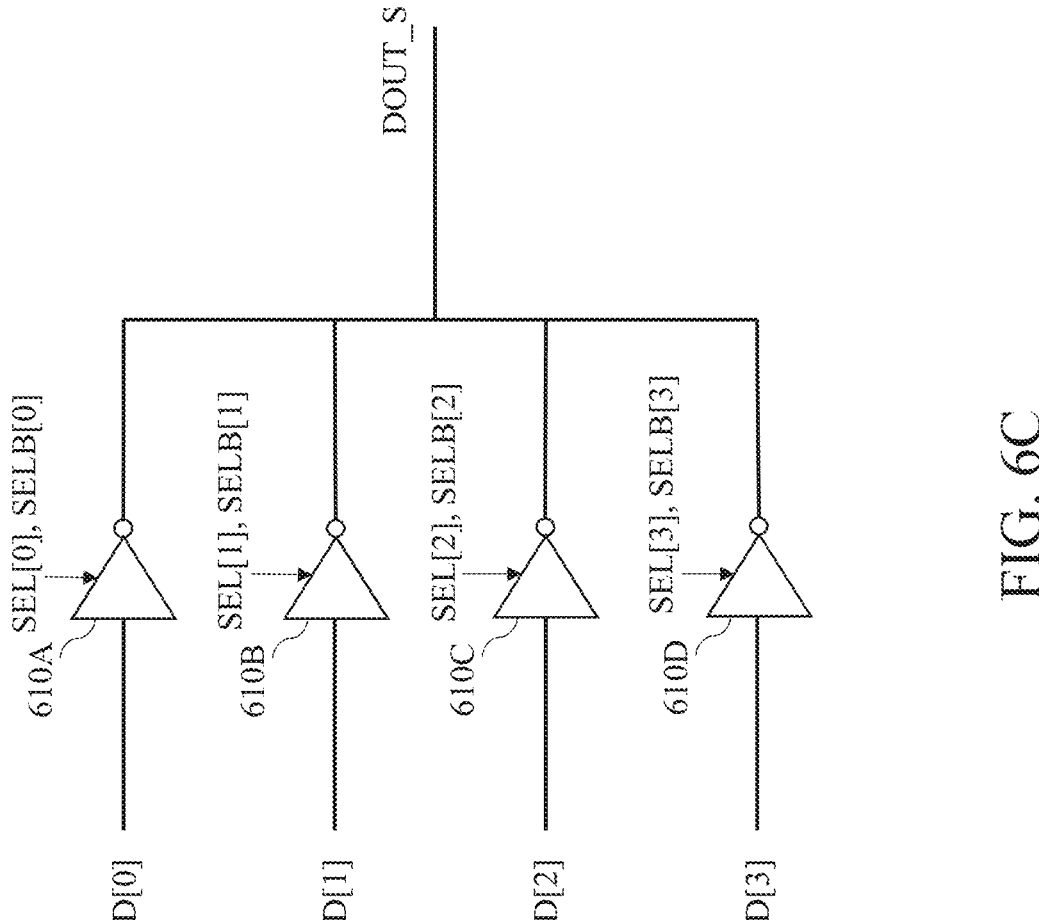
FIG. 6C is a schematic diagram of a 4-bit selection circuit in accordance with some embodiments of the present disclosure.

FIG. 6A is a block diagram of an inverter for use in a selection circuit in accordance with some embodiments of the present disclosure. FIG. 6B is a schematic diagram of the inverter in FIG. 6A. FIG. 6C is a schematic diagram of a 4-bit selection circuit in accordance with some embodiments of the present disclosure.

In some embodiments, the inverter 610 may be a selection-controlled inverter which is controlled by selection signals SEL and SELB, as depicted in FIG. 6A. Additionally, the selection signal SELB (e.g., 1-bit signal) is complementary to the selection signal SEL. Herein, the selection signals SEL and SELB shown in FIG. 6A may be corresponding bits within the selection signals SEL[0:3] and SELB[0:3] shown in FIGS. 5A-5D.

In some embodiments, the inverter 610 may include transistors Q1 to Q4 formed in a stacked structure or a cascode structure. Transistors Q1 to Q4 are controlled by the input data signal DIN (e.g., 1-bit signal), selection signal SEL, selection signal SELB, and input data signal DIN, respectively. For example, when the selection signals SEL and SELB are respectively in the low logic state and the high logic state, transistors Q3 and Q2 are turned on. At this time, if the input data signal DIN is in the low logic state, transistor Q4 is turned on and transistor Q1 is turned off, resulting in the output data signal DOUT being pulled up to the high logic state (e.g., power supply voltage VDD). If the input data signal DIN is in the high logic state, transistor Q4 is turned off and transistor Q1 is turned on, resulting in the output data signal DOUT being pulled down to the low logic state (e.g., ground). Additionally, when the selection signals SEL and SELB are respectively in the high logic state and the low logic state, transistors Q3 and Q2 are turned off, resulting in the output data signal DOUT being floating. This indicates that the logic state of the input data signal DIN is not passed to the output data signal DOUT at this time.

Referring to FIG. 6C, the selection circuit 201 shown in FIG. 2 can be implemented using the selection circuit 201A shown in FIG. 6C. For example, the selection circuit 201A includes four inverters 610A to 610D, supporting 1-to-1 to 4-to-1 serialization modes. Specifically, when the serializer 1041 is set to the 1-to-1, 2-to-1, 3-to-1, and 4-to-1 serialization modes, respective bits within the selection signals SEL[0:3] and SELB[0:3] shown in FIGS. 5A to 5D can be applied to the inverters 610A to 610D, respectively.

Figure 7A:
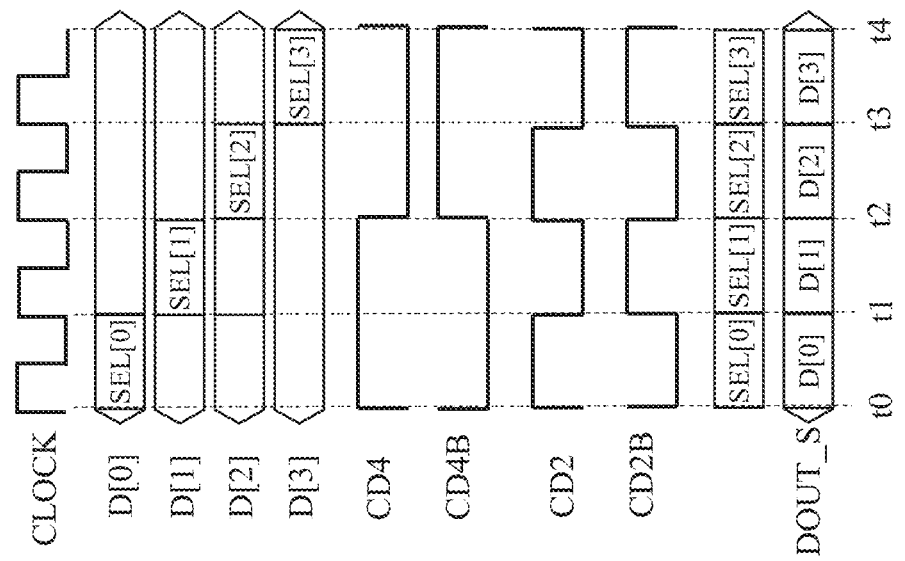
FIG. 7A is a waveform diagram of various signals of the serializer during a 4-to-1 serialization operation in accordance with some embodiments of the present disclosure.

For example, referring to FIG. 7A, which illustrates a waveform diagram of various signals of the serializer during a 4-to-1 serialization operation, the respective bits within the selection signals SEL[0:3] and SELB[0:3] shown in FIG. 5D can be applied to the inverters 610A to 610D. During the first clock cycle of the input clock signal CLOCK (e.g., time t0 to t1), the least significant bit SEL[0] of the selection signal SEL[0:3] is in the high logic state, and the remaining bits SEL[1:3] of the selection signal SEL[0:3] are in the low logic state, selecting the least significant bit D[0] of the input data signal as the serial output data signal DOUT_S. During the second clock cycle of the input clock signal CLOCK (e.g., time t1 to t2), the bit SEL[1] of the selection signal SEL[0:3] is in the high logic state, and the remaining bits of the selection signal SEL[0:3] are in the low logic state, selecting the bit D[1] of the input data signal as the serial output data signal DOUT_S. During the third clock cycle of the input clock signal CLOCK (e.g., time t2 to t3), the bit SEL[2] of the selection signal SEL[0:3] is in the high logic state, and the remaining bits of the selection signal SEL[0:3] are in the low logic state, selecting the bit D[2] of the input data signal as the serial output data signal DOUT_S. Lastly, during the fourth clock cycle of the input clock signal CLOCK (e.g., time t3 to t4), the bit SEL[3] of the selection signal SEL[0:3] is in the high logic state, and the remaining bits of the selection signal SEL[0:3] are in the low logic state, selecting the bit D[3] of the input data signal as the serial output data signal DOUT_S.

Figure 7B:
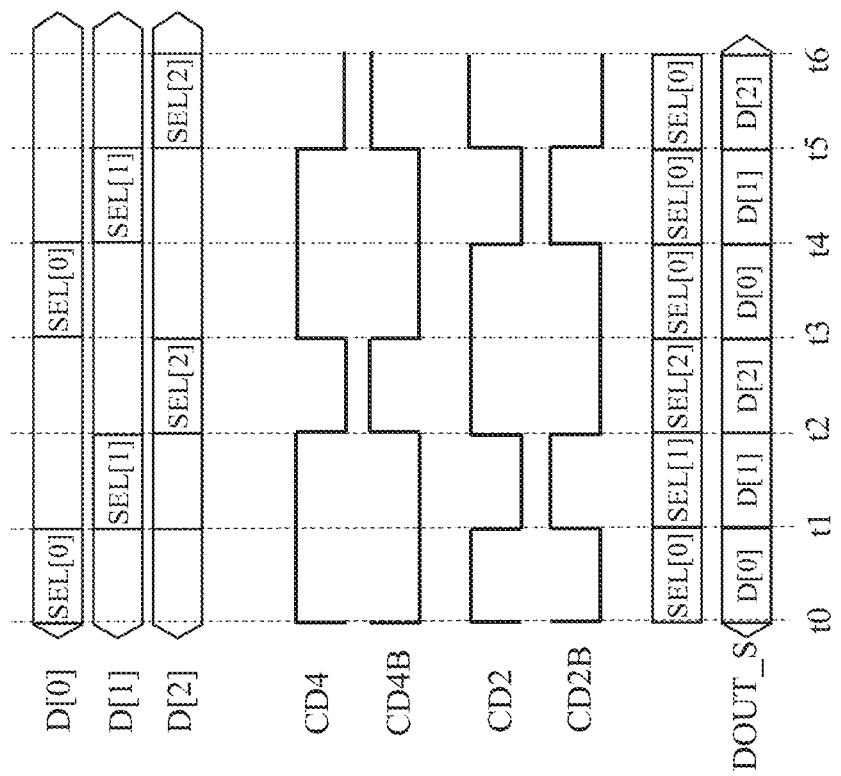
FIG. 7B is a waveform diagram of various signals of the serializer during a 3-to-1 serialization operation in accordance with some embodiments of the present disclosure.

Referring to FIG. 7B, which illustrates a waveform diagram of various signals of the serializer during a 3-to-1 serialization operation (i.e., not a power of 2), the respective bits within the selection signals SEL[0:3] and SELB[0:3] shown in FIG. 5C can be applied to the inverters 610A to 610D. Since there are three valid bits (e.g., D[0:2]) within the input data signal D, the inverter 610D is deactivated during the 3-to-1 serialization operation. During the first clock cycle of the input clock signal CLOCK (e.g., time t0 to t1), the least significant bit SEL[0] of the selection signal SEL[0:3] is in the high logic state, and the remaining bits SEL[1:3] of the selection signal SEL[0:3] are in the low logic state, selecting the least significant bit D[0] of the input data signal as the serial output data signal DOUT_S. During the second clock cycle of the input clock signal CLOCK (e.g., time t1 to t2), the bit SEL[1] of the selection signal SEL[0:3] is in the high logic state, and the remaining bits of the selection signal SEL[0:3] are in the low logic state, selecting the bit D[1] of the input data signal as the serial output data signal DOUT_S. During the third clock cycle of the input clock signal CLOCK (e.g., time t2 to t3), the bit SEL[2] of the selection signal SEL[0:3] is in the high logic state, and the remaining bits of the selection signal SEL[0:3] are in the low logic state, selecting the bit D[2] of the input data signal as the serial output data signal DOUT_S. Accordingly, the 3-to-1 serialization procedure of the 3-bit input data signal DIN is completed, and a subsequent 3-to-1 serialization procedure of a next 3-bit input data signal DIN start from time t3. The operations of the 3-to-1 serialization operation within the duration from time t3 to t6 can be referred to those within the duration from time t0 to t3, and the details thereof will not be repeated here.

Figure 8A:
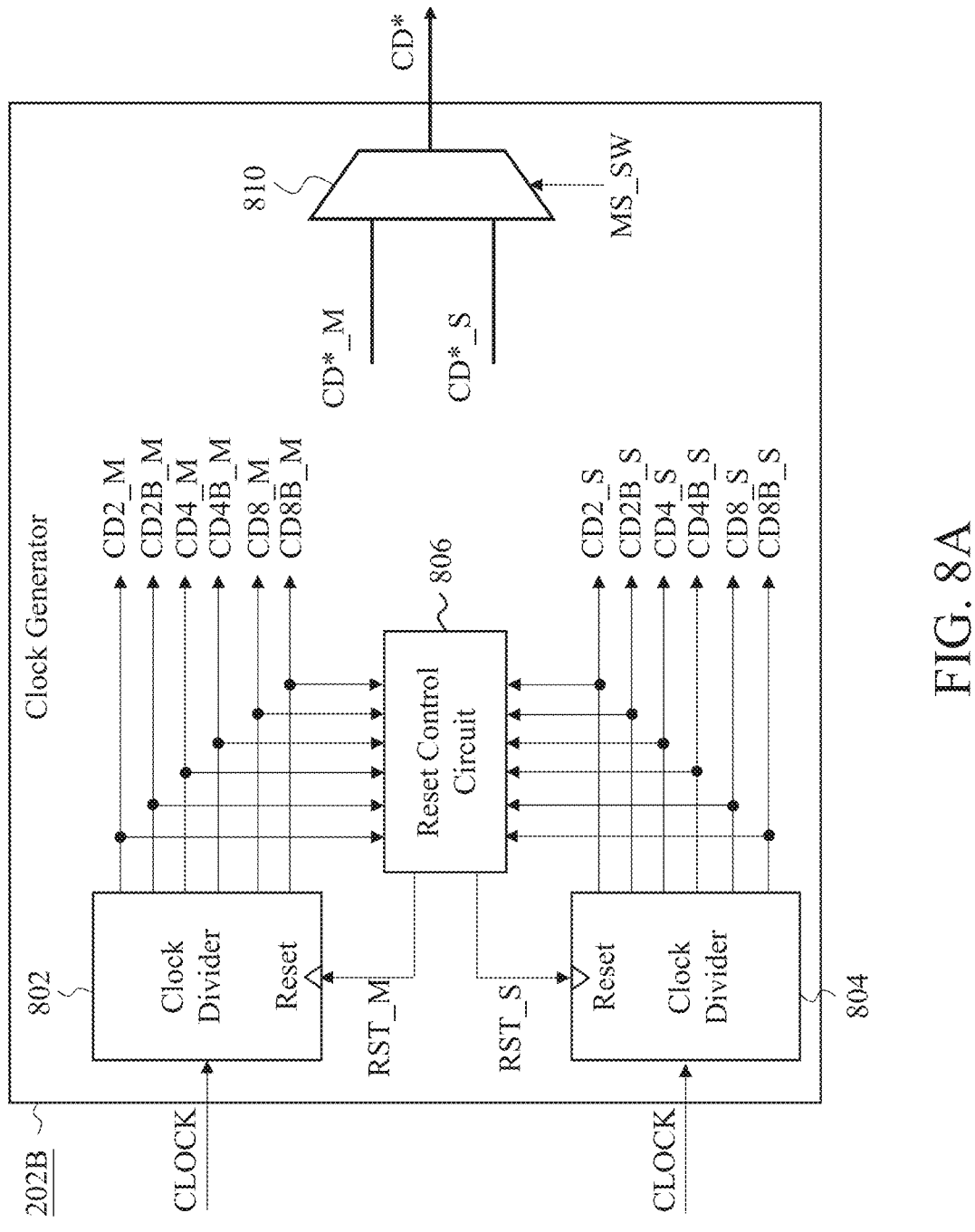
FIG. 8A is another block diagram of a clock generator in accordance with some embodiments of the present disclosure.

FIG. 8A is another block diagram of a clock generator in accordance with some embodiments of the present disclosure.

In some embodiments, the clock generator 202 shown in FIG. 2 can be implemented using the clock generator 202B shown in FIG. 8A. The clock generator 202B shown in FIG. 8A may be similar to the clock generator 202A shown in FIG. 3, with the difference being that the clock generator 202B supports 1-to-1 to 8-to-1 serialization modes. For example, the clock divider 802 and 804 can support clock dividing factors of 2, 4, and 8, allowing in the hardware configuration of the serializer 202B to support 8-to-1 serialization, which converts an 8-bit parallel data signal into the serial output data signal of 8 bits within 8 clock cycles of the input clock signal CLOCK. It should be noted that the reset control circuit 806 may generate the reset signals RST_M and RST_S for the clock dividers 802 and 804 using the divided clock signals CD8_M, CD8B_M, CD8_S, and CD8B_S in addition to the divided clock signals shown in FIG. 3.

Figure 8B:
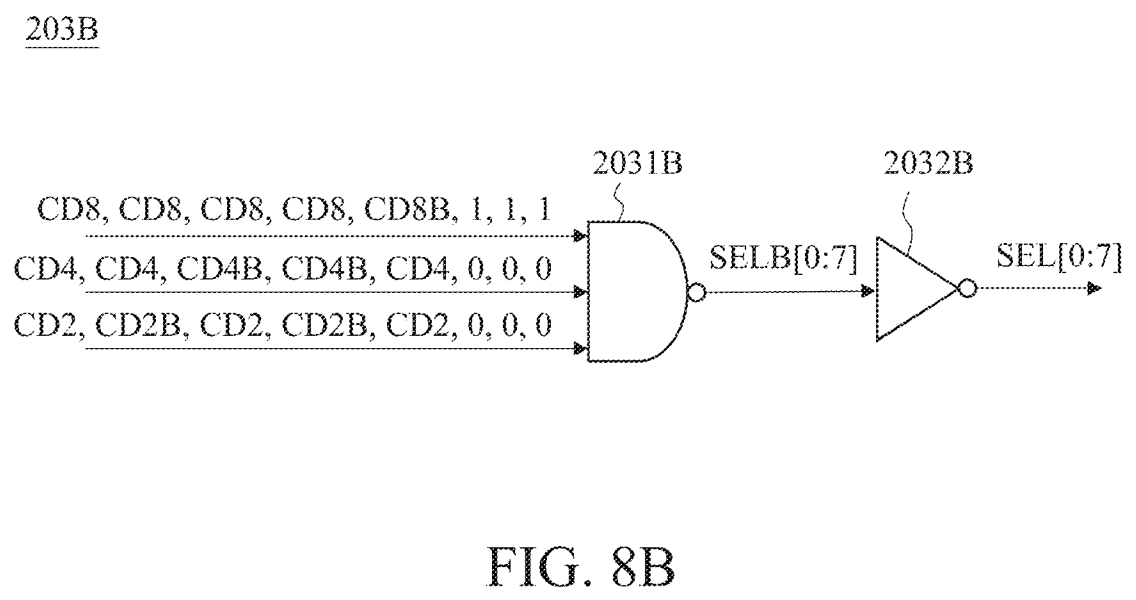

FIG. 8B is another block diagram of a selection control circuit in accordance with some embodiments of the present disclosure.

In some embodiments, the selection control circuit 203 shown in FIG. 2 can be implemented using the selection control circuit 203B shown in FIG. 8B. The selection control circuit 203B shown in FIG. 8B may be similar to the selection control circuit 203A shown in FIGS. 5A-5D, with the difference being that the NAND gate 2031B of the selection control circuit 203B receives three predetermined input signals, thereby supporting up to 8-to-1 serialization. For example, during a 5-to-1 serialization operation, the three predetermined input signals may include (CD8, CD8, CD8, CD8, CD8B, 1, 1, 1), (CD4, CD4, CD4B, CD4B, CD4, 0, 0, 0), and (CD2, CD2B, CD2, CD2B, CD2, 0, 0, 0). The NAND gate 2031B performs bitwise NAND operations to each bit of these three predetermined input signals, generating the selection signal SELB[0:7] being ((CD8·CD4·CD2)', (CD8·CD4·CD2B)', (CD8·CD4B·CD2)', (CD8·CD4B·CD2B)', (CD8B·CD4·CD2)', 1, 1, 1). Subsequently, the inverter 2032B inverts the selection signal SELB[0:7] to generate the selection signal SEL[0:7] being ((CD8·CD4·CD2), (CD8·CD4·CD2B), (CD8·CD4B·CD2), (CD8·CD4B·CD2B), (CD8B·CD4·CD2), 1, 1, 1). Therefore, the least significant five bits of the selection signal SEL[0:7] is ((CD8·CD4·CD2), (CD8·CD4·CD2B), (CD8·CD4B·CD2), (CD8·CD4B·CD2B), (CD8B·CD4·CD2)), indicating that the least five significant bits DIN[0:4] of the input data signal DIN can be selected sequentially every five clock cycles of the input clock signal CLOCK.

Figure 8C:
FIG. 8C is another block diagram of a selection circuit in accordance with some embodiments of the present disclosure.

FIG. 8C is another block diagram of a selection circuit in accordance with some embodiments of the present disclosure.

In some embodiments, the selection circuit 201 shown in FIG. 2 can be implemented using the selection circuit 201B shown in FIG. 8C. The selection circuit 201B may be similar to the selection circuit 201A shown in FIG. 6C, with the difference being that the selection circuit 201B includes eight inverters 810A to 810H. For example, the number of inverters within the selection circuit 201B may be the same as the width of the selection signals SEL[0:7] and SELB[0:7]. Each of the inverters 810A to 810H may be similar to the inverter 610 shown in FIGS. 6A and 6B, and is controlled by a respective bit of the selection signals SEL[0:7] and SELB[0:7] to output a respective bit of the input data signal D, as depicted in FIG. 8C.

In some embodiments, the inverters 810A to 810H in FIG. 8C and inverters 610A to 610D in FIG. 6C can be implemented using CMOS transmission gates, and each CMOS transmission gate is controlled by a respective bit of the selection signals SEL and SELB.

Figure 9A:
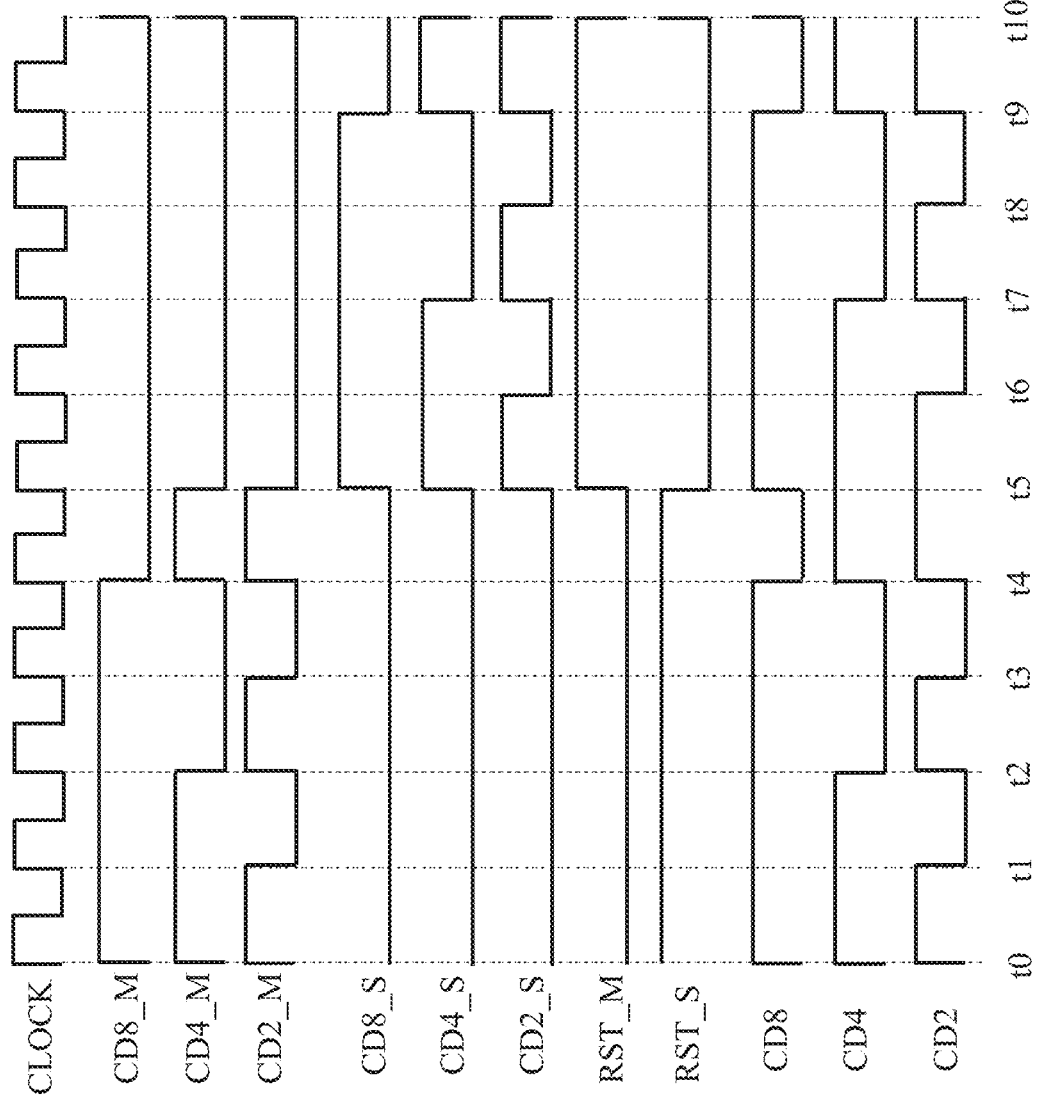
FIG. 9A is a waveform diagram of various signals for 5-to-1 serialization during operation of the clock generator in FIG. 8A.

FIG. 9A is a waveform diagram of various signals for 5-to-1 serialization during operation of the clock generator in FIG. 8A.

In some embodiments, when a 5-to-1 serialization operation is performed, the reset signals RST_M and RST_S are in the low logic state and high logic state within the duration from time t0 to t5, activating the clock divider 802 and deactivating the clock divider 804. Accordingly, the multiplexing circuit 810 selects the divided clock set CD*_M generated by the clock divider 802 within the duration from time t0 to t5 since the selection control signal MS_SW (e.g., referring to equation (1)) is in the low logic state. Thus, the control clock signals CD8, CD4 and CD2 follow the divided clock signals CD8_M, CD4_M and CD2_M within the duration from time t0 to t5 (e.g., 5 clock cycles of the input clock signal CLOCK). Subsequently, the reset control circuit 806 may detect the specific pattern of the control clock signals CD8, CD4 and CD2, such as CD8=0, CD4=1 and CD2=1, at the rising edge of the input clock signal CLOCK at time t5, and the reset control circuit 806 then toggles the logic states of the reset signals RST_M and RST_S, resulting in the reset signal RST_M being 1 and the reset signal RST_S being 0. Due to 5-to-1 serialization, the reset signals RST_M and RST_S are kept at the high logic state and low logic state within the duration from time t5 to t10 (e.g., 5 clock cycles of the input clock signal CLOCK). Thus, the clock divider 802 is deactivated and the clock divider 804 is activated within the duration from time t6 to t10. In other words, the clock divider 804 starts to generate the divided clock signals CD8_S, CD4_S and CD2_S from time t5, resulting in the control clock signals CD8, CD4 and CD2 respectively following the divided clock signals CD8_S, CD4_S and CD2_S generated by the clock divider 804 within the duration from time t5 to t10.

Figure 9B:
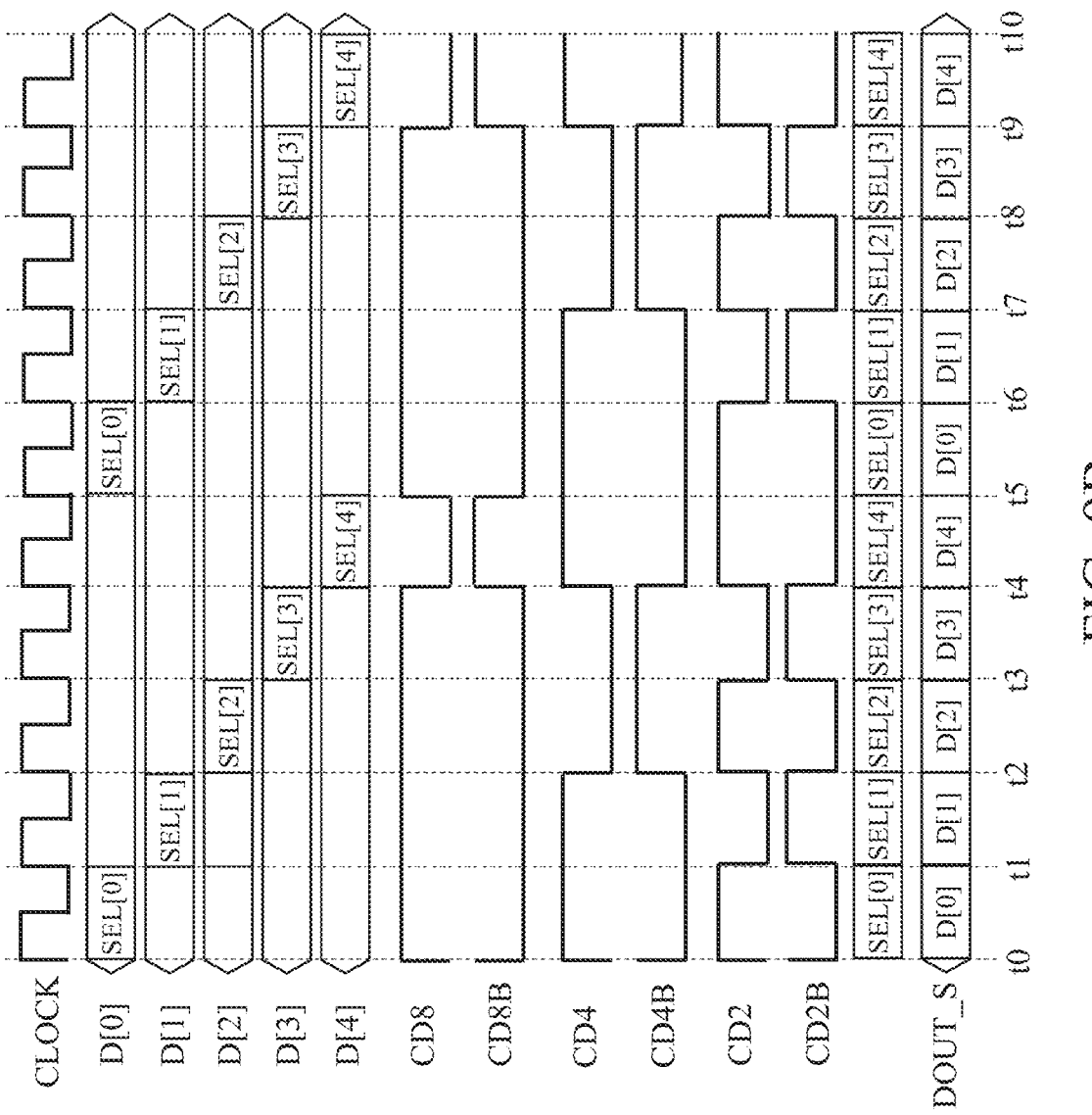
FIG. 9B is a waveform diagram of various signals within the serializer during a 5-to-1 serialization operation in accordance with the embodiment of FIG. 9A.

Referring to FIG. 9B, which illustrates a waveform diagram of various signals within the serializer during a 5-to-1 serialization operation in accordance with the embodiment of FIG. 9A, the respective bits within the selection signals SEL[0:7] and SELB[0:7] shown in FIG. 8B can be applied to the inverters 810A to 810H shown in FIG. 8C. Since there are five valid bits (e.g., D[0:4]) within the input data signal D, the inverters 810F to 810H are deactivated during the 5-to-1 serialization operation. During the first clock cycle of the input clock signal CLOCK (e.g., time t0 to t1), the least significant bit SEL[0] of the selection signal SEL[0:7] is in the high logic state, and the remaining bits of the selection signal SEL[0:7] are in the low logic state, selecting the least significant bit D[0] of the input data signal as the serial output data signal DOUT_S. During the second clock cycle of the input clock signal CLOCK (e.g., time t1 to t2), the bit SEL[1] of the selection signal SEL[0:7] is in the high logic state, and the remaining bits of the selection signal SEL[0:7] are in the low logic state, selecting the bit D[1] of the input data signal as the serial output data signal DOUT_S. During the third clock cycle of the input clock signal CLOCK (e.g., time t2 to t3), the bit SEL[2] of the selection signal SEL[0:7] is in the high logic state, and the remaining bits of the selection signal SEL[0:7] are in the low logic state, selecting the bit D[2] of the input data signal as the serial output data signal DOUT_S. During the fourth clock cycle of the input clock signal CLOCK (e.g., time t3 to t4), the bit SEL[3] of the selection signal SEL[0:7] is in the high logic state, and the remaining bits of the selection signal SEL[0:7] are in the low logic state, selecting the bit D[3] of the input data signal as the serial output data signal DOUT_S. During the fifth clock cycle of the input clock signal CLOCK (e.g., time t4 to t5), the bit SEL[4] of the selection signal SEL[0:7] is in the high logic state, and the remaining bits of the selection signal SEL[0:7] are in the low logic state, selecting the bit D[4] of the input data signal as the serial output data signal DOUT_S. Accordingly, the 5-to-1 serialization procedure of the 5-bit input data signal DIN[0:4] is completed, and a subsequent 5-to-1 serialization procedure of a next 5-bit input data signal DIN[0:4] start from time t5. The operations of the 5-to-1 serialization operation within the duration from time t5 to t10 can be referred to those within the duration from time t0 to t5, and the details thereof will not be repeated here.

Therefore, the serializer proposed in the present disclosure can perform serialization in any ratio, such as N-to-1, where N is a positive integer. The selection-based multiplexing circuit can implement an arbitrary-ratio parallel-to-serial converter. Additionally, the clock dividers used in the serializer are synchronous clock dividers, ensuring that the timing sequence of the divided clock signals is reliable. Moreover, the generation of the control clock set and selection signals can be implemented using simple logic gates, thereby generating well-controlled selection signals with low latency (e.g., combinational logic within one clock cycle of the input clock signal) and low power consumption. Thus, the jitters occurring on the transmission of the serial output data signal from the transmitter to the receiver through the communication channel can be reduced. Furthermore, the proposed serializer can also be implemented using a more advanced technology node, and it can ensure the setup time and hold time margin for the serial output data signal regardless of the operating speed of the proposed serializer.

Figure 10:
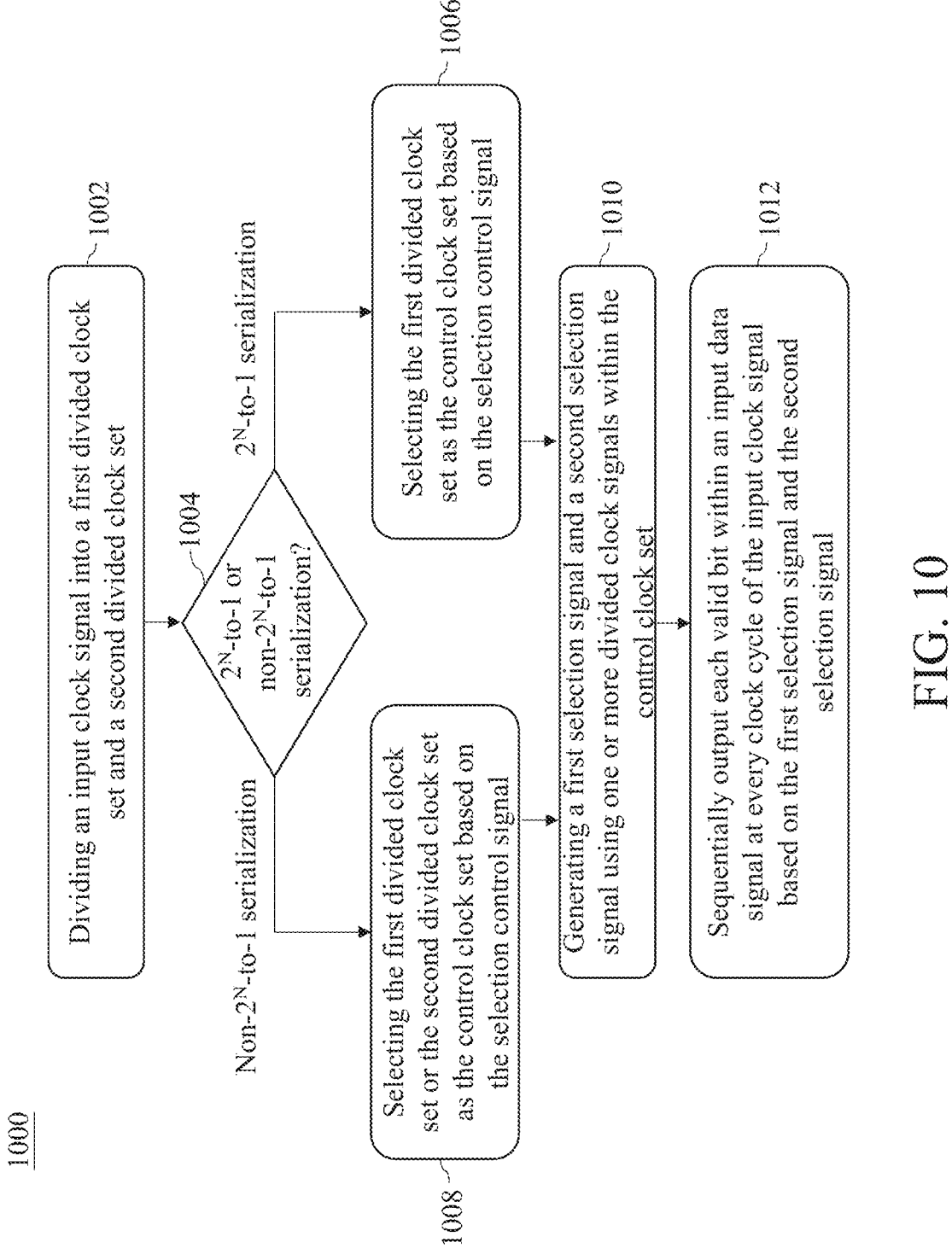
FIG. 10 is a flowchart of a method for operating a serializer in accordance with some embodiments of the present disclosure.

FIG. 10 is a flowchart of a method for operating a serializer in accordance with some embodiments of the present disclosure. The flow 1000 of FIG. 10 may include other operations not illustrated here, and the various illustrated operations of method may be performed in a different order than shown. Please refer to FIGS. 8A-8C and FIG. 10.

At operation 1002, an input clock signal is divided into a first divided clock set and a second divided clock set, wherein the first divided clock set comprises a plurality of first divided clock signals of a plurality of dividing factors, and the second divided clock set comprises a plurality of second divided clock signals of the plurality of dividing factors. For example, the dividing factors are different powers of 2, such as 2, 4, 8, 16, etc.

At operation 1004, it is determined whether a $2^N$-to-1 serialization mode or a non-$2^N$-to-1 serialization mode is used, wherein N is a positive integer. When it is determined that a $2^N$-to-1 serialization mode is performed, operation 1006 is performed. When it is determined that a non-$2^N$-to-1 serialization mode is performed, operation 1008 is performed.

At operation 1006, the first divided clock set is selected as a control clock set based on a selection control signal. For example, the first divided clock set may be the divided clock set CD*_M (e.g., including CD8_M, CD8B_M, CD4_M, CD4B_M, CD2_M, CD2B_M) generated by the clock divider 802, which is a master clock divider. Additionally, when entering the $2^N$-to-1 serialization mode, the reset signals RST_M and RST_S generated by the reset control signal circuit 806 are in the low logic state and the high logic state, respectively, resulting in the switch control signal MS_SW being in the low logic state.

At operation 1008, the first divided clock set or the second divided clock set is selected as the control clock set based on the selection control signal. For example, the second divided clock set may be the divided clock set CD*_S (e.g., including CD2_S, CD2B_S, CD4_S, CD4B_S, CD8_S, CD8B_S) generated by the clock divider 804, which is a slave clock divider. Additionally, the reset control circuit 806 may toggle the logic states of the reset signals RST_M and RST_S upon detecting a specific pattern of the control clock signals, resulting in the selection control signal MS_SW to change its logic state to switch the control clock set from the first divided clock set to the second divided clock set, or vice versa.

At operation 1010, a first selection signal and a second selection signal are generated using one or more divided clock signals within the control clock set. For example, the first selection signal and the second selection signal may be the selection signals SEL[0:7] and SELB[0:7], as shown in FIG. 8B.

At operation 1012, each valid bit within an input data signal is sequentially outputted at every clock cycle of the input clock signal based on the first selection signal and the second selection signal. For example, each bit of the selection signal SEL[0:4] is sequentially changed to the high logic state within the duration of five clock cycles, such as time t0 to t5 and t5 to t10 shown in FIG. 9B, enabling the selection circuit 801 to sequentially output each bit of the input data signal D[0:4] every clock cycle within the 5-clock-cycle duration.

An aspect of the present disclosure provides a circuit, which includes a clock generator, a selection control circuit, and a selection circuit. The clock generator is configured to divide an input clock signal into a first divided clock set and a second divided clock set, and generate a control clock set from the first divided clock set and the second divided clock. The selection control circuit is configured to generate a first selection signal and a second selection signal using the control clock set. The selection circuit is configured to sequentially output each bit of an input data signal within a duration of predetermined clock cycles of the input clock signal based on the first selection signal and the second selection signal.

Another aspect of the present disclosure provides a circuit, which includes a clock generator, a selection control circuit, and a selection circuit. The clock generator includes a first clock divider and a second clock divider. The first clock divider is configured to divide an input clock signal into a first divided clock set. The second clock divider is configured to divide the input clock signal into a second divided clock set. The first divided clock set and the second divided clock set comprise a plurality of first divided clock signals and a plurality of second divided clock signals generated by dividing the input clock signal in different powers of 2. The selection control circuit is configured to generate a first selection signal and a second selection signal using a control clock set. The selection circuit is configured to sequentially output each bit of an input data signal within a duration of predetermined clock cycles of the input clock signal based on the first selection signal and the second selection signal.

Yet another aspect of the present disclosure provides a method for operating a serializer. The serializer includes a clock generator, a selection control circuit, and a selection circuit. The method includes the following steps: utilizing the clock generator to divide an input clock signal into a first divided clock set and a second divided clock set; in response to the serializer entering a non-2N-to-1 serialization mode, utilizing the clock generator to select the first divided clock set or the second divided clock set as a control clock set based on a selection signal; utilizing the selection control circuit to generate a first selection signal and a second selection signal using one or more divided clock signals within the control clock set; and utilizing the selection circuit to sequentially output each valid bit within an input data signal at every clock cycle of the input clock signal based on the first selection signal and the second selection signal.

The methods and features of the present disclosure have been sufficiently described in the provided examples and descriptions. It should be understood that any modifications or changes without departing from the spirit of the present disclosure are intended to be covered in the protection scope of the present disclosure.

Moreover, the scope of the present application is not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, can be utilized according to the present disclosure.

Accordingly, the appended claims are intended to include within their scope processes, machines, manufacture, compositions of matter, means, methods or steps. In addition, each claim constitutes a separate embodiment, and the combination of various claims and embodiments are within the scope of the present disclosure.

What is claimed is:

1. A circuit, comprising:
a clock generator, configured to divide an input clock signal into a first divided clock set and a second divided clock set, and generate a control clock set from the first divided clock set and the second divided clock;
a selection control circuit, configured to generate a first selection signal and a second selection signal using the control clock set; and
a selection circuit, configured to sequentially output each bit of an input data signal within a duration of predetermined clock cycles of the input clock signal based on the first selection signal and the second selection signal.

2. The circuit of claim 1, wherein the first divided clock set comprises a plurality of first divided clock signals of a plurality of dividing factors, and the second divided clock set comprises a plurality of second divided clock signals of the plurality of dividing factors.

3. The circuit of claim 2, wherein the dividing factors are different powers of 2.

4. The circuit of claim 1, wherein when the circuit enters a $2^N$-to-1 serialization mode, wherein N is a positive integer, the clock generator is further configured to select the first divided clock set as the control clock set based on a selection control signal.

5. The circuit of claim 4, wherein when the circuit enters a non-$2^N$-to-1 serialization mode, the clock generator is further configured to select the first divided clock set or the second divided clock set as the control clock set based on the selection control signal.

6. The circuit of claim 5, wherein the clock generator comprises a first clock divider and a second clock divider that divide the input clock signal into the first divided clock set and the second divided clock set, respectively, and the selection control signal is generated based on a first reset signal of the first clock divider and a second reset signal of the second clock divider.

7. The circuit of claim 6, wherein:
the first reset signal and the second reset signal are respectively in a low logic state and a high logic state during the $2^N$-to-1 serialization mode; and
one of the first reset signal and the second reset signal is in the high logic state, and the other of the first reset signal and the second reset signal is in the low logic state during the non-$2^N$-to-1 serialization mode.

8. The circuit of claim 7, wherein the selection control circuit comprises:

a NAND gate, configured to a plurality of predetermined input signals generated from the control clock set to generate the second selection signal; and
an inverter, configured to invert the second selection signal to generate the first selection signal.

9. The circuit of claim 8, wherein the selection circuit comprises a plurality of selection sub-circuits, and each selection unit is controlled by a respective bit within the first selection signal and the second selection signal to output a corresponding bit of the input data signal.

10. The circuit of claim 9, wherein the selection sub-circuits are selection-controlled inverters.

11. The circuit of claim 10, wherein the selection sub-circuits are CMOS (complementary metal oxide semiconductor) transmission gates.

12. A circuit, comprising:
a clock generator, comprising:
a first clock divider, configured to divide an input clock signal into a first divided clock set; and
a second clock divider, configured to divide the input clock signal into a second divided clock set;
wherein the first divided clock set and the second divided clock set comprise a plurality of first divided clock signals and a plurality of second divided clock signals generated by dividing the input clock signal in different powers of 2;
a selection control circuit, configured to generate a first selection signal and a second selection signal using a control clock set; and
a selection circuit, configured to sequentially output each bit of an input data signal within a duration of predetermined clock cycles of the input clock signal based on the first selection signal and the second selection signal.

13. The circuit of claim 12, wherein the first clock divider and the second clock divider are synchronous clock dividers for the input clock signal.

14. The circuit of claim 12, wherein the clock generator further comprises a reset control circuit configured to generate a first reset signal of the first clock divider and a second reset signal of the second clock divider based on a plurality of control clock signals within the control clock set.

15. The circuit of claim 14, wherein the clock generator further comprises a multiplexing circuit, configured to select the first divided clock set as the control clock set based on a selection control signal when the circuit enters a $2^N$-to-1 serialization mode based on a selection control signal, where N is a positive integer.

16. The circuit of claim 15, wherein the multiplexing circuit is further configured to select the first divided clock set or the second divided clock set as the control clock set based on the selection control signal when the circuit enters a non-$2^N$-to-1 serialization mode.

17. The circuit of claim 16, wherein:
the first reset signal and the second reset signal are respectively in a low logic state and a high logic state during the 2N-to-1 serialization mode; and
one of the first reset signal and the second reset signal is in the high logic state, and the other of the first reset signal and the second reset signal is in the low logic state during the non-2N-to-1 serialization mode.

18. The circuit of claim 17, wherein the first clock divider sets the first divided clock signals to zero in response to the first reset signal being in the high logic state, and the second clock divider sets the second divided clock signals to zero in response to the second reset signal being in the high logic state.

19. A method for operating a serializer, the serializer comprising a clock generator, a selection control circuit, and a selection circuit, the method comprising:

utilizing the clock generator to divide an input clock signal into a first divided clock set and a second divided clock set;

in response to the serializer entering a non-$2^N$-to-1 serialization mode, utilizing the clock generator to select the first divided clock set or the second divided clock set as a control clock set based on a selection control signal, wherein N is a positive integer;

utilizing the selection control circuit to generate a first selection signal and a second selection signal using one or more divided clock signals within the control clock set; and utilizing the selection circuit to sequentially output each valid bit within an input data signal at every clock cycle of the input clock signal based on the first selection signal and the second selection signal.

20. The method of claim 19, further comprising:

in response to the serializer entering a $2^N$-to-1 serialization mode, utilizing the clock generator to select the first divided clock set as the control clock set based on the selection control signal.

* * * * *